(12) United States Patent
Eustace

(10) Patent No.: US 11,820,474 B2
(45) Date of Patent: Nov. 21, 2023

(54) FEEDTHROUGHS FOR ENCLOSURES IN DEEP WATER VESSELS

(71) Applicant: Aqua Satellite, Inc., Menlo Park, CA (US)

(72) Inventor: Robert Alan Eustace, Menlo Park, CA (US)

(73) Assignee: Aqua Satellite, Inc., Menlo Park, CA (US)

( * ) Notice: Subject to any disclaimer, the term of this patent is extended or adjusted under 35 U.S.C. 154(b) by 232 days.

(21) Appl. No.: 17/486,618

(22) Filed: Sep. 27, 2021

(65) Prior Publication Data

US 2022/0111944 A1 Apr. 14, 2022

Related U.S. Application Data

(60) Provisional application No. 63/091,757, filed on Oct. 14, 2020.

(51) Int. Cl.
*B63G 8/04* (2006.01)
*H05K 5/02* (2006.01)
*H01R 43/20* (2006.01)

(52) U.S. Cl.
CPC .............. *B63G 8/04* (2013.01); *H05K 5/0247* (2013.01); *H01R 43/20* (2013.01)

(58) Field of Classification Search
None
See application file for complete search history.

(56) References Cited

U.S. PATENT DOCUMENTS

| | | | | |
|---|---|---|---|---|
| 5,450,519 A | * | 9/1995 | Iwanski | G02B 6/3816 385/139 |
| 5,515,465 A | * | 5/1996 | Olin | G02B 6/4248 385/59 |
| 5,592,049 A | * | 1/1997 | Heider | H01J 9/323 313/623 |
| 5,796,676 A | * | 8/1998 | Chang | G01V 1/186 367/20 |
| 6,067,395 A | * | 5/2000 | Cairns | H02G 15/14 385/139 |
| 6,982,383 B1 | * | 1/2006 | Spellman | G01V 1/201 174/80 |

(Continued)

*Primary Examiner* — Xanthia C Cunningham
(74) *Attorney, Agent, or Firm* — KILPATRICK TOWNSEND & STOCKTON LLP

(57) ABSTRACT

An enclosure structure suitable for high-pressure environments includes a feedthrough for coupling components housed within the enclosure structure to components external to the enclosure structure. The enclosure structure includes a housing comprising one or more cavities for receiving one or more electronic components within an interior of the housing and a bore through the housing. The one or more electronic components comprises a connector element and the bore comprises a non-tapered portion and a tapered portion. The non-tapered portion is proximate to the interior of the housing and the tapered portion is proximate to the exterior of the housing. The bore is configured to receive a feedthrough pin for coupling the connector element to an external component external to the enclosure structure. The enclosure structure also includes a feedthrough pin extending through the bore and a potting material disposed within the tapered portion surrounding the feedthrough pin.

20 Claims, 7 Drawing Sheets

(56) References Cited

U.S. PATENT DOCUMENTS

| | | | | |
|---|---|---|---|---|
| 7,120,087 B2* | 10/2006 | Lee | ............ | G01V 1/201 |
| | | | | 367/20 |
| 7,189,131 B2* | 3/2007 | Kotter | ............ | H01J 9/323 |
| | | | | 313/317 |
| 7,464,728 B2* | 12/2008 | Cairns | ............ | F16L 55/17 |
| | | | | 138/155 |
| 9,634,427 B2* | 4/2017 | Lerner | ............ | H01R 13/5202 |
| 11,451,022 B2* | 9/2022 | Hellmann | ............ | H02G 3/22 |
| 2003/0228783 A1* | 12/2003 | Cairns | ............ | G02B 6/4428 |
| | | | | 439/204 |
| 2011/0006137 A1* | 1/2011 | Rapp | ............ | F02M 61/168 |
| | | | | 239/585.1 |
| 2013/0065429 A1* | 3/2013 | Spahi | ............ | E21B 33/0385 |
| | | | | 439/521 |
| 2013/0183853 A1* | 7/2013 | Sivik | ............ | H02G 3/22 |
| | | | | 439/519 |
| 2018/0151977 A1* | 5/2018 | Moser | ............ | H05K 7/1462 |
| 2018/0299239 A1* | 10/2018 | Eitschberger | ............ | F42D 1/045 |
| 2019/0312399 A1* | 10/2019 | Seeley | ............ | H01R 24/58 |

* cited by examiner

800

- 810 — Form a housing comprising one or more cavities for receiving one or more electronic components within an interior of the housing, wherein the one or more electronic components comprises a connector element

- 820 — Form a bore through the housing, wherein the bore comprises a non-tapered portion and a tapered portion, the non-tapered portion being proximate to the interior of the housing and the tapered portion being proximate to the exterior of the housing

- 830 — Insert a feedthrough pin through the bore for coupling the connector element to an external component external to the enclosure structure, wherein a first end of the connector element is configured to be coupled to the connector element and a second end of the connector element is configured to be coupled to the external component

- 840 — Dispose a potting material within the tapered portion surrounding the feedthrough pin.

*FIG. 8*

FEEDTHROUGHS FOR ENCLOSURES IN DEEP WATER VESSELS

CROSS-REFERENCE TO RELATED APPLICATION

This application claims priority to and the benefit of U.S. Provisional Patent Application No. 63/091,757, filed Oct. 14, 2020, which is hereby incorporated by reference in its entirety for all purposes.

BACKGROUND OF THE INVENTION

The pressure at the bottom of the ocean can be as high as 15,750 pounds per square inch (psi). As a result of the engineering challenges associated with design in this regime, deep bodies of water like the ocean remains largely unexplored. Deep-water exploration involves sending vessels with electronics for imaging or otherwise detecting features around the vessels. The electronics are housed in special enclosures for protecting the electronics from the extremes such as the high pressure presented by deep water.

Despite the progress made in the area of ocean exploration, methods and systems are needed for protecting components of deep water pressure vessels.

SUMMARY OF THE INVENTION

This disclosure presents a novel approach to provide a cheap and efficient way to allow standard, off-the-shelf electronics to operate in high pressure environments. In particular, the disclosure describes a number of embodiments related to enclosures for protecting electronic components in high-pressure environments. The enclosures described herein may be used to protect electronic components such as circuit board assemblies, batteries, sensor assemblies, processors, and data storage devices under high pressures. In some embodiments, the electronic components within these enclosures may need to be physically coupled (e.g., electronically, optically, or otherwise) with components outside of the enclosures. However, such a physical coupling may introduce risks to structural stability of the enclosure or may create a source of leakage. As such, designs for special feedthroughs that maintain structural stability and prevent leakage (e.g., at extreme pressures) are disclosed. Although some of the embodiments discussed herein are related to methods and system for protecting electrical components in deep-water applications, it is to be understood that the approaches described here may be employed in protecting any suitable components in any suitable application where high pressures are involved.

Embodiments of the present disclosure include an enclosure structure suitable for high-pressure environments, the enclosure structure having a feedthrough for coupling components housed within the enclosure structure to components external to the enclosure structure. The enclosure structure may include: a housing including one or more cavities for receiving one or more electronic components within an interior of the housing, wherein the one or more electronic components includes a connector element; a bore through the housing, wherein the bore includes a non-tapered portion and a tapered portion, the non-tapered portion being proximate to the interior of the housing and the tapered portion being proximate to the exterior of the housing, and wherein the bore is configured to receive a feedthrough pin for coupling the connector element to an external component external to the enclosure structure; a feedthrough pin extending through the bore, the feedthrough pin having a first end and a second end, wherein the first end is configured to be coupled to the connector element and the second end is configured to be coupled to the external component; and a potting material disposed within the tapered portion surrounding the feedthrough pin.

In some embodiments, the enclosure structure further includes an envelope surrounding the housing, wherein the envelope is impermeable to water when the enclosure structure is held at 15,750 pounds per square inch, and wherein the feedthrough pin extends to an exterior of the envelope. In some embodiments, the enclosure structure further includes an envelope cap disposed on the exterior of the envelope, wherein the feedthrough pin extends to the exterior of the envelope via the envelope cap. In some embodiments, the envelope cap includes: an envelope-cap bore through which the feedthrough pin extends, the envelope-cap bore including a tapered portion; and a potting material disposed within the envelope-cap bore surrounding the feedthrough pin. In some embodiments, the envelope includes an elongated portion, wherein the feedthrough pin extends to the exterior of the envelope via the elongated portion, and wherein the enclosure structure further includes a sealing structure disposed around at least part of the elongated portion. In some embodiments, the sealing structure includes a heat shrink tubing. In some embodiments, the envelope includes a mylar-based material. In some embodiments, the envelope includes a plastic material.

In some embodiments, the housing includes a fiberglass composite material. In some embodiments, the fiberglass composite material includes FR-4. In some embodiments, the envelope further includes a housing cap disposed along the exterior of the housing over the potting material. In some embodiments, the potting material is an epoxy. In some embodiments, the one or more electronic components includes a battery. In some embodiments, the one or more electronic components includes one or more circuit components on a circuit board assembly.

In some embodiments, the tapered portion includes an interior end facing the interior of the housing and an exterior end facing the exterior of the housing, wherein a cross-section of the interior end is less than a cross-section of the exterior end. In some embodiments, the non-tapered portion includes a cylindrical portion, and wherein the tapered portion includes a conical portion. In some embodiments, the feedthrough pin includes a rigid or flexible electrical conductor. In some embodiments, the one or more electronics components further includes circuit components mounted on a circuit board, a battery assembly, or a sensor assembly.

Embodiments of the present disclosure include a method of manufacturing an enclosure structure with a feedthrough for coupling components housed within the enclosure structure to components external to the enclosure structure. The method may include: forming a housing including one or more cavities for receiving one or more electronic components within an interior of the housing, wherein the one or more electronic components includes a connector element; forming a bore through the housing, wherein the bore includes a non-tapered portion and a tapered portion, the non-tapered portion being proximate to the interior of the housing and the tapered portion being proximate to the exterior of the housing; inserting a feedthrough pin through the bore for coupling the connector element to an external component external to the enclosure structure, wherein a first end of the connector element is configured to be coupled to the connector element and a second end of the connector element is configured to be coupled to the external component; and disposing a potting material within the tapered portion surrounding the feedthrough pin.

In some embodiments, the method further includes: placing the housing within an envelope, wherein the envelope is impermeable to water when the enclosure structure is held at 15,750 pounds per square inch; and causing the feedthrough pin to extend to an exterior of the envelope. In some embodiments, the method further includes causing the feedthrough pin to extend through an envelope cap disposed on the exterior of the envelope. In some embodiments, the envelope cap includes: an envelope-cap bore through which the feedthrough pin extends, the envelope-cap bore including a tapered portion; and disposing a potting material within the envelope-cap bore to surround the feedthrough pin so as to create a seal around the feedthrough pin.

In some embodiments, the method further includes disposing an envelope cap on the exterior of the envelope around the feedthrough pin so as to create a seal around the feedthrough pin. In some embodiments, the method further includes: extending the feedthrough pin through an elongated portion of the envelope to the exterior of the envelope; and disposing a sealing structure around at least part of the elongated portion so as to create a seal between the elongated portion and the feedthrough pin.

In some embodiments, the sealing structure includes a heat shrink tubing, wherein disposing the sealing structure includes: placing the heat shrink tubing around the elongated portion; and applying heat to the heat shrink tubing to cause the heat shrink tubing to shrink and wrap around the elongated portion and the feedthrough pin.

Numerous benefits are achieved by way of the present disclosure over conventional techniques. For example, embodiments of the present disclosure provide enclosures that are able to physically and/or electrically couple components within the enclosure to components external to the enclosure while maintaining structural stability and prevent leakage at high pressures (e.g., in deep-water environments). As explained in the disclosure, the enclosures may include feedthrough mechanisms that do not need to rely on metal materials to ensure appropriate fixation and functionality. These and other embodiments of the disclosure, along with many of their advantages and features, are described in more detail in conjunction with the text below and attached figures.

BRIEF DESCRIPTION OF THE DRAWINGS

FIG. 8 illustrates an example method for manufacturing an enclosure structure with a feedthrough for coupling components housed within the enclosure structure to components external to the enclosure structure.

DETAILED DESCRIPTION OF SPECIFIC EMBODIMENTS

Figure 1A:
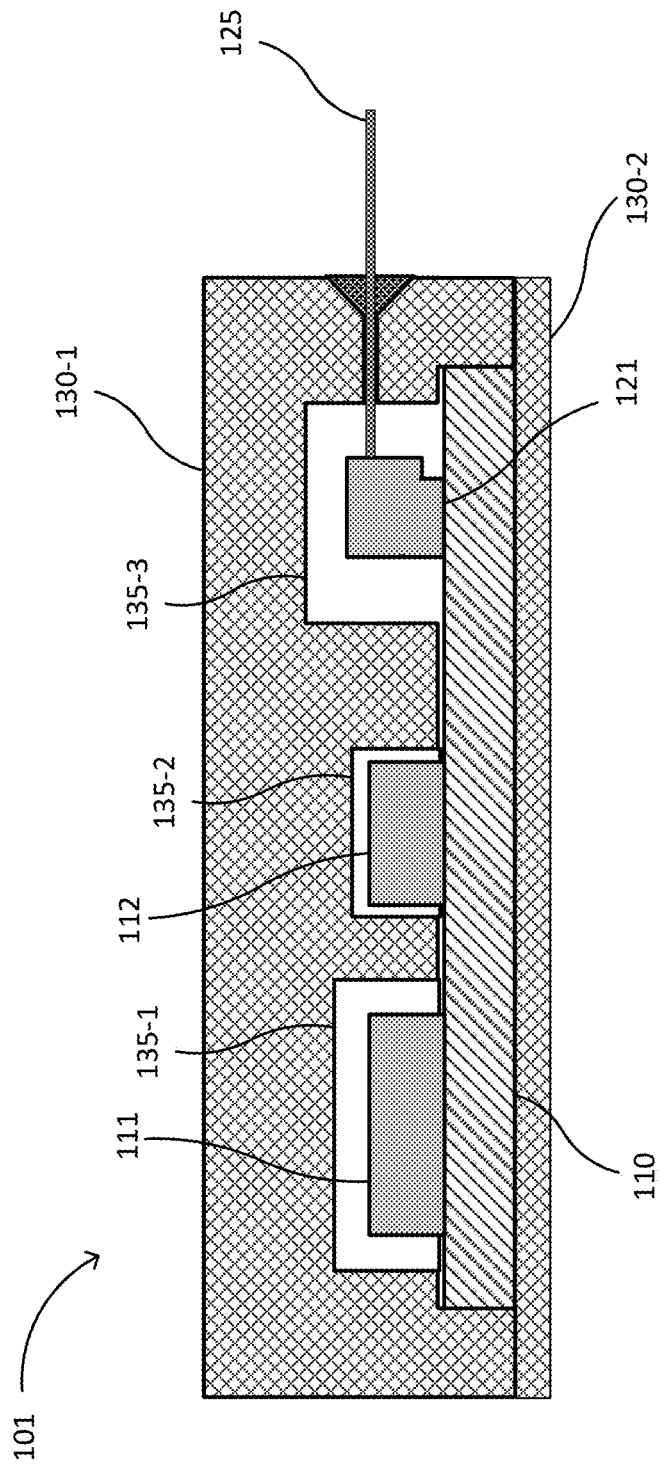
FIG. 1A is a simplified, cross-sectional schematic diagram of an enclosure that includes a circuit board assembly.

The present disclosure describes a number of embodiments related to enclosures for protecting electronic components in high-pressure environments. Such high-pressure environments may include deep-water environments such as regions near the ocean floor, where extremely high pressures may be experienced (e.g., 15,750 pounds per square inch (psi), or about 108,592 kilopascals). The enclosures described herein may be used in a number of deep-water application such as deep-water exploration. In high-pressure environments (e.g., associated with deep-water applications), components of any deep-water vessel experience tremendous compressive forces that would damage any ordinary electronics if not protected. The enclosures described herein may be used to protect electronic components such as circuit board assemblies, batteries, sensor assemblies, processors, and data storage devices under high pressures (e.g., near the ocean floor). In some embodiments, the electronic components within these enclosures may need to be physically coupled (e.g., electronically, optically, or otherwise) with components outside of the enclosures. However, such a physical coupling may introduce risks to the structural stability of the enclosure or may create a source of leakage. As such, designs for special feedthroughs that maintain structural stability and prevent leakage (e.g., at extreme pressures) are disclosed.

The typical approach is to place components that cannot be subjected to such pressures inside an enclosure that can take those pressures. For example, a circuit board might be positioned inside a steel cylinder with very thick walls. The cylinder and end caps will be designed in a way that also keeps the enclosure waterproof, typically using O-rings to keep the water and pressure out. One complication is that the components within an enclosure may need to be physically and/or electrically coupled with components external to the enclosure. For example, circuit boards (e.g., circuit boards with processors for operating various functions of a deep-water vessel) may need to connect to a battery source for power, sensors, actuators, and data. These may require physical coupling with wires or cables, which may need to go from inside the enclosure to outside the enclosure of the circuit boards. Off-the-shelf bulkhead connectors or wire feedthroughs may be used, but these solutions are problematic in that they require an enclosure made out of thick metal (e.g., steel or titanium) since these connectors or wire feedthroughs need to be screwed into the enclosure. Such metal enclosures are heavy, expensive, hard to design, and hard to manufacture. Moreover, with respect to deep-water vessels, it may be advantageous for such vessels to be neutral or positively buoyant, in which case each pound of metal may need a large amount of low-density material to offset the metal (e.g., for each pound of metal, three pounds of synthetic foam may be needed as an offset). This may significantly increase the size and weight of the vessel, which may increase the size and weight of the motor, which may increase the size and weight of the batteries that the vessel needs to carry. Consequently, such an approach would result in a very large, heavy, and expensive vehicle.

An ideal design would be a lightweight, cheap, non-metal enclosure. However, as discussed above, many enclosures may need to have physical wires or cable extending out of the enclosures, in which case, such a design may only be possible with a feedthrough mechanism that does not rely on metal materials. Designs for such a feedthrough mechanism are disclosed herein so as to create enclosures that do not need to rely on metal. The disclosed designs also include features that provide increased stability and prevent leakage, as will become apparent from the disclosure.

FIG. 1A is a simplified, cross-sectional schematic diagram of an enclosure 101 that includes a circuit board assembly. The example enclosure 101 includes the circuit board assembly and an enclosure structure (e.g., in FIG. 1A, everything other than the circuit board assembly) that protects the circuit board assembly. The circuit board assembly may include the circuit board 110 and one or more circuit components (e.g., the circuit components 111, 112, and 121), which may be mounted on the circuit board 110. As illustrated in FIG. 1A, the enclosure structure may include a housing that is configured to distribute pressure throughout the enclosure in a predetermined manner. In some embodiments, the housing may include a top part 130-1 and a bottom part 130-2 (collectively referenced herein as housing 130). In some embodiments, the housing may be partially defined by the circuit board 110, which may form the bottom part of the housing. In some embodiments, at least part of the housing may be made of a material that is suitable for high-pressure environments. For example, the housing 130 may include a material including FR-4 (flame retardant 4), which is a glass-reinforced epoxy laminate material that may be made of woven fiberglass cloth with an epoxy resin binder. FR-4 is a high-strength, durable material that can endure extremely high pressures without failing, and can endure large degrees of compression and high shear stress. Furthermore, FR-4 is electrically insulating (which is utilized to prevent electrical shorts) but thermally conductive. This thermal conductivity may be beneficial for electronics encased in a sealed enclosure (particularly in a tight enclosure), where generated heat (e.g., released from on-board processors) may become trapped. In some embodiments, the housing may include or may be composed of any other suitable material, which may or may not be the same material as the circuit board. In some embodiments, the housing may include a metal layer (e.g., as an outer layer), or may be made entirely of metal (e.g., aluminum, steel, titanium).

In some embodiments, the housing may include one or more cavities for receiving one or more electronic components within an interior of the housing. For example, referencing FIG. 1A, the housing 130 of the illustrated circuit board assembly enclosure 101 may include cavities 135-1, 135-2, and 135-3 for receiving the circuit components 111, 112, and 121, respectively (and also a cavity for receiving the circuit board 110 itself). As another example, a housing of a battery assembly enclosure may be shaped to include one or more cavities dimensioned so as to receive batteries of the battery assembly. In some embodiments, one or more of the cavities may be sized to be larger than the electronic components so as to reduce the pressure exerted on the electronic components. For example, referencing FIG. 1A, the cavities for the circuit components 111, 112, and 121 are larger than the respective circuit components.

Figure 1B:
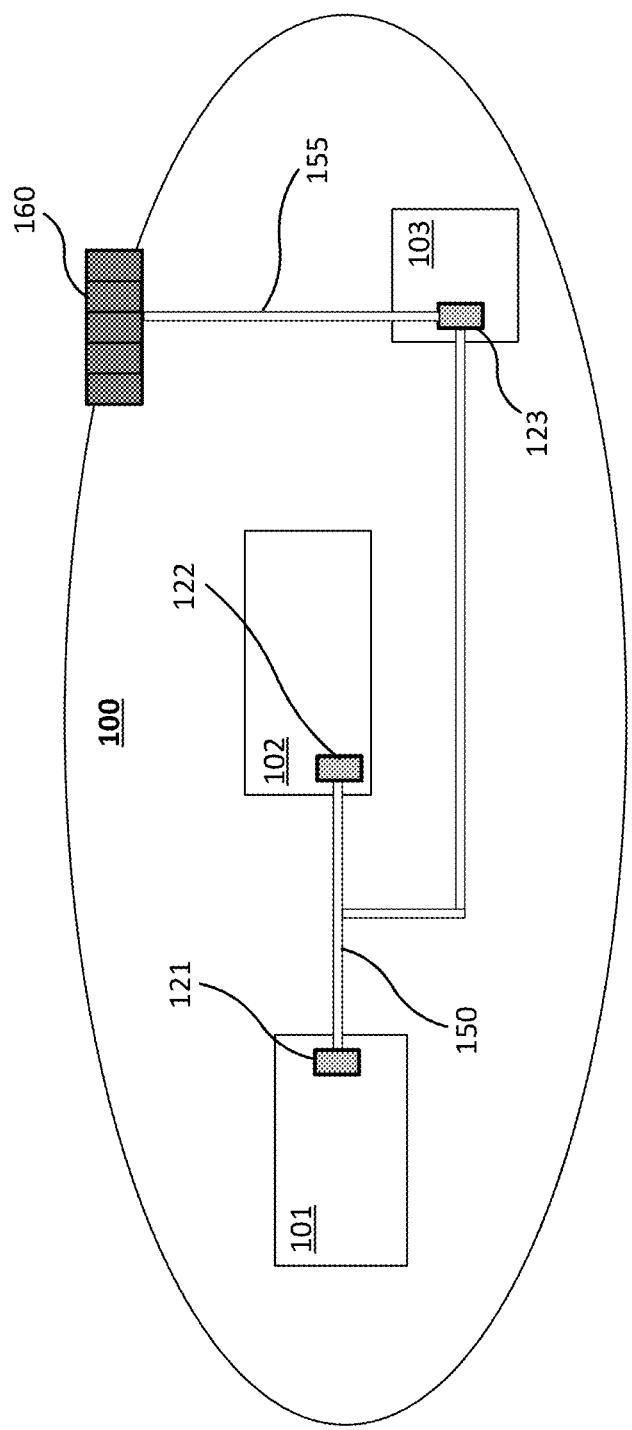
FIG. 1B illustrates a simplified schematic of an example deep-water vessel including three separate enclosures for different electronic components within the deep-water vessel and an electronic component external to the deep-water vessel.

FIG. 1B illustrates a simplified schematic of an example deep-water vessel 100 including three separate enclosures 101, 102, and 103 for different electronic components within the deep-water vessel 100 and an electronic component external to the deep-water vessel 100 (e.g., the solar charging assembly 160). In some embodiments, the enclosures disclosed herein may be suitable for protecting electronics within deep-water vessels (e.g., vehicles that are suited for operating in extreme pressures such as environments near the ocean floor). In some embodiments, the deep-water vessel 100 may include a liquid such as water within its hull, such that each of the enclosures may need to be waterproof to protect components therein. In some embodiments, components housed within each enclosure may need to be physically coupled to other components external to the enclosure (e.g., electrically, optically, or otherwise). In the example illustrated in FIG. 1B, the enclosure 101 may include a circuit board including one or more processors and one or more memories; the enclosure 102 may include a sensor and associated component; and the enclosure 103 may include components of a battery assembly. In this example, the enclosure 101 may need to communicate with the enclosures 102 and 103, the enclosure 102 may need to communicate with the enclosures 101 and 103, and the enclosure 103 may need to communicate with the enclosures 101 and 102. In some embodiments, an enclosure may need to communicate with components external to the deep-water vessel 100. For example, the enclosure 103 (e.g., a battery assembly) may need to communicate with a solar charging assembly 160, which may be disposed on the exterior of the deep-water vessel 100. Such communication may include the transmission/reception of data (e.g., electrical or optical signals) or electric current (e.g., for supplying power, charging, etc.). In some cases, a physical feedthrough (e.g., a wire, cable, or similar element) may need to exit an enclosure to couple components within the enclosure to components external to the enclosure so as to allow for such communication. The feedthroughs may be part of conduits between components of different enclosures, or between components within an enclosure and components not within an enclosure (e.g., the solar charging assembly 160 illustrated in FIG. 1B). For example, referencing FIG. 1B, the conduit 150 may couple components in the enclosure 101 to components in the enclosures 102 and 103, and the conduit 155 may couple components of the enclosure 103 (e.g., a battery assembly) with the solar charging assembly 160. In the example illustrated in FIG. 1B, each of the enclosures 101, 102, and 103 may have a single connector element. For example, enclosure 101 may have circuit component 121 that can be a single connector element, and enclosures 102 and 103 may have single connector elements 122 and 123, respectively. In other embodiments, an enclosure may have multiple such connector elements and multiple conduits emanating from the enclosure.

In some embodiments, conduits extending to/from an enclosure may include one or more feedthrough pins that extend from within an enclosure to an exterior of the enclosure. For example, referencing FIG. 1A, a feedthrough pin 125 may extend from within the enclosure 101 to the exterior of the enclosure 101. In some embodiments, feedthrough pins may be connected to one or more connector elements that bring together all inputs and outputs for the electronics in an enclosure (e.g., a circuit board assembly, a battery assembly, a sensor assembly, a data storage device) so that electrical and data transmissions can be coupled via the connector element. For example, referencing FIG. 1A, the circuit component 121 may be a connector element, and the feedthrough pin 125 may be coupled to the connector element. As another example, an enclosure for a battery assembly may include a connector element that includes positive and negative terminals for the battery assembly. For purposes of this disclosure, a "feedthrough pin" is defined broadly to include any physical coupling structure for allowing communication of data or electrical current to and from a sealed enclosure. A feedthrough pin may include an electrical conductor, an optical fiber, or any other suitable element for transmitting data or electrical current. The feedthrough pin may be rigid (e.g., a rigid wire or cable) or flexible (e.g., a flexible wire or cable).

Feedthrough pins that extend outside of an enclosure may offer several engineering challenges. A first challenge may be that when the enclosure is disposed in a high-pressure environment (e.g., the ocean floor, where the pressure may be about 15,750 psi), a feedthrough pin extending from the interior of the enclosure to the exterior of the enclosure may experience significant forces that may undermine structure integrity of the conduit or of the enclosure. For example, referencing FIG. 1A, pressure levels outside the enclosure 101 may be higher than pressure levels within the enclosure. In this example, the pressure differential may cause the feedthrough pin 125 to experience a force that may push the feedthrough pin 125 inward toward the interior of the enclosure 101, and may ultimately undermine the structural integrity of the feedthrough pin 125, or the circuit component 121 (e.g., a connector element), or the housing 130. A second challenge may involve keeping the enclosure watertight. In some cases, the enclosure may need to be waterproof to protect the electronics housed within, a feedthrough pin that extends into the enclosure may compromise this waterproof nature of the enclosure. As discussed above, in some embodiments, the enclosure may be surrounded by a liquid such as water. Any aperture through which the feedthrough pin may extend into the enclosure may become a source of water leakage into the enclosure. Disclosed herein are solutions for providing structural stability to feedthrough pins and for keeping the enclosure watertight around the feedthrough pin.

Although FIG. 1A illustrates a circuit component 121 as a single connector element, the disclosure contemplates that any number of connector elements may be used. Similarly, although FIG. 1A illustrates a single feedthrough pin 125, it is to be appreciated that this is only for illustrative purposes, and any suitable number of feedthrough pins may be used as needed. Although FIG. 1A illustrates an enclosure for protecting a circuit board assembly, the disclosure contemplates that a similar enclosure may be developed for protecting any suitable electronics. For example, a similar enclosure may be developed for a battery assembly (e.g., with cavities for battery components and connector elements), a sensor assembly (e.g., with cavities for sensor components and connector elements). Moreover, although FIG. 1B illustrates conduits for enclosures within a deep-water vessel 100, the disclosure contemplates conduits between enclosures for any suitable applications. For example, the enclosures may be housed within an immovable structure on an ocean floor, or any other high-pressure environment. As another example, the enclosures may be standalone enclosures that are not housed within any vessel or structure.

Figure 2A:
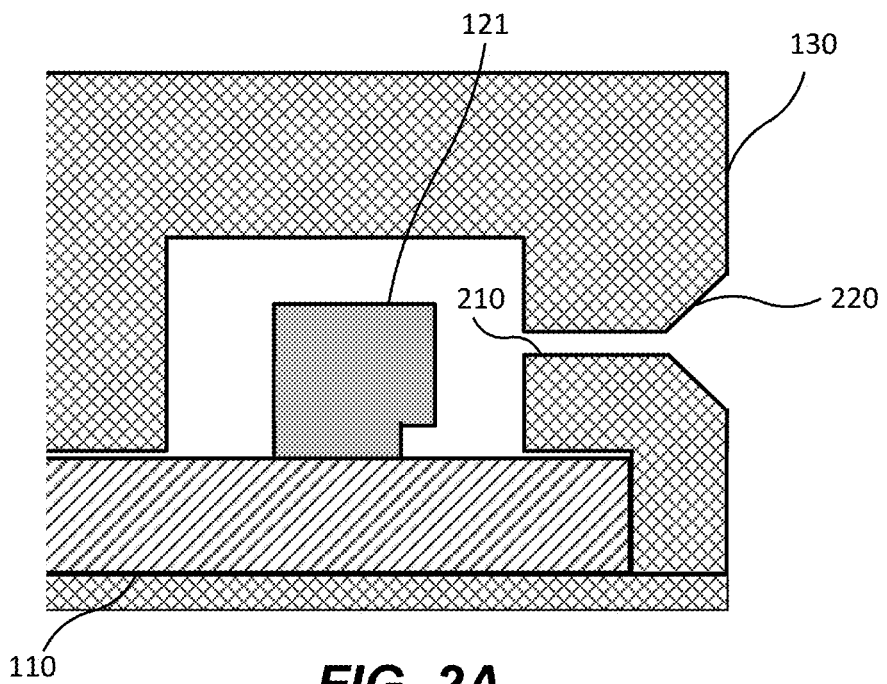
FIGS. 2A-2C illustrate cross-section views of a portion of the enclosure near the connector element-feedthrough pin interface.
Figure 2B:
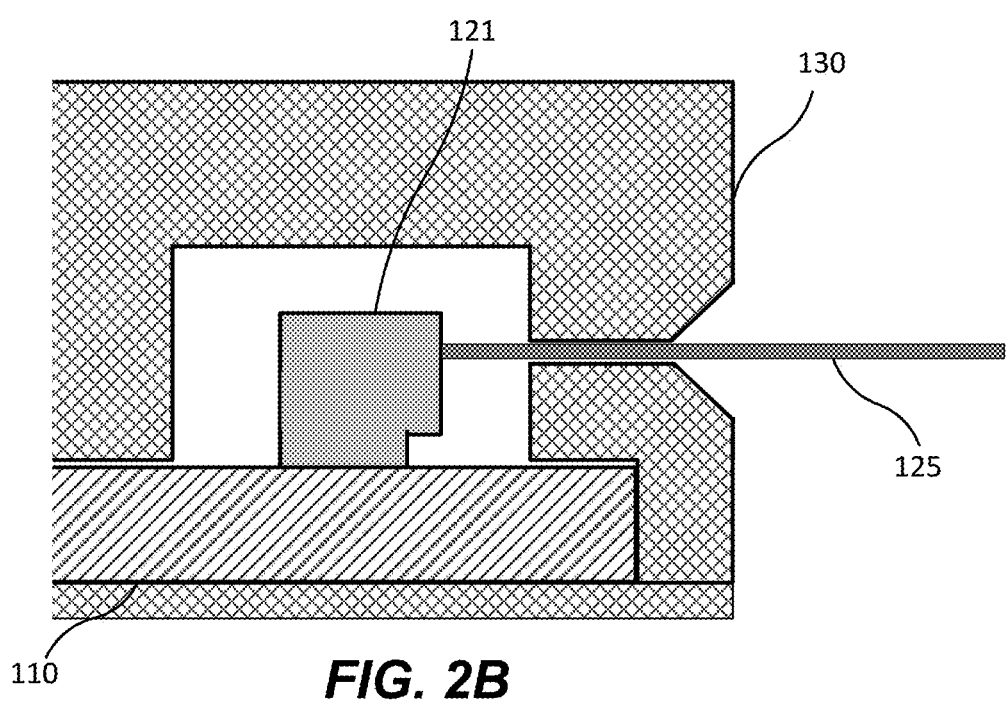
Figure 2C:
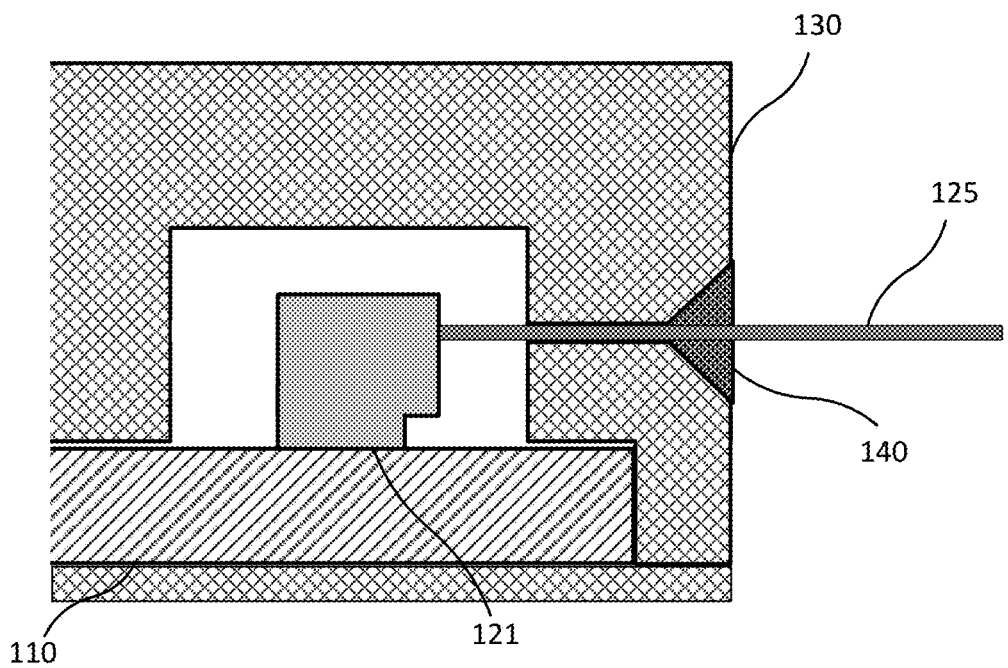

FIGS. 2A-2C illustrate cross-section views of a portion of the enclosure 101 near the connector element-feedthrough pin interface. In some embodiments, the housing may include a bore through which a feedthrough pin may extend so as to couple a connector element to an external component. In some embodiments, the bore may include a tapered portion, where the tapered portion includes an interior end facing the interior of the housing and an exterior end facing the exterior of the housing. The tapered portion may be conical, or may otherwise be dimensioned such that cross-sections of the tapered portion vary axially from the interior end to the exterior end. For example, a cross-section of the interior end may be less than a cross-section of the exterior end. An example of this is illustrated by the tapered portion 220 of FIG. 2A. In the illustrated embodiment of FIG. 2A, the cross-section of the tapered portion 220 continuously increases from the interior end to the exterior end (e.g., the tapered portion 220 may be conical). In other embodiments, the cross-section of the tapered portion may decrease from the interior and to the exterior end.

In some embodiments, the bore may additionally include a non-tapered portion, which may be, for example, cylindrical, rectangular, or may otherwise have any other suitable non-tapered shape. As an example, referencing FIG. 2A, the illustrated bore includes a non-tapered portion 210. FIG. 2B illustrates the same view of FIG. 2A with the feedthrough pin 125 coupled with the circuit component 121 (e.g., connector element) and extending through the tapered and non-tapered portions of the bore. In some embodiments, the feedthrough pin may then be secured in place using a potting material. For example, FIG. 2C illustrates a potting material 140, which may be disposed within the tapered portion (and/or the non-tapered portion) surrounding the feedthrough pin 125. The potting material 140 may provide for structural fixation of the feedthrough pin 125 as well as a watertight seal around the feedthrough pin 125.

FIGS. 2A-2C illustrates what may be a progression of steps for coupling a feedthrough pin to a connector element (FIGS. 2A-2B), and then securing the feedthrough pin to a bore (FIG. 2C). In some embodiments, the potting material may include an epoxy material, a polymer material, or any other material suitable for filling in the bore and creating a seal around the feedthrough pin 125.

The tapered portion of the bore is advantageous in that when the pressure outside the enclosure increases, the potting material will be compressed inward (both axially toward the interior of the enclosure and also radially). This inward compression may cause the potting material to pinch against the one or more feedthrough pins that go through the potting material. As a result, a tight seal may be formed around the feedthrough pins. This seal ensures structural stability of the enclosure by securing the feedthrough pins in place so that they do not succumb to the pressure differential as described above and move inward. Additionally, the seal may prevent liquid (e.g., water) from leaking into the enclosures through the bore created for the feedthrough pins. In this way, the tapered geometry of the bore offers a way to make use of the high pressure environment in creating a more secure, watertight enclosure.

Figure 3:
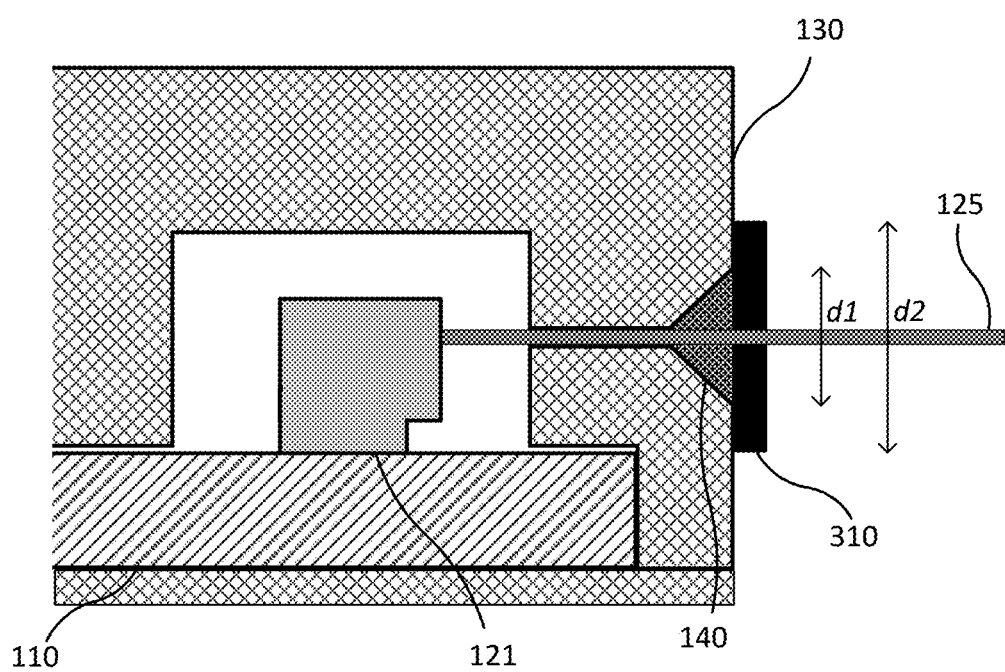
FIG. 3 illustrates a portion of an enclosure with a housing cap disposed on an exterior of the housing.

FIG. 3 illustrates a portion of an enclosure with a housing cap 310 disposed on an exterior of the housing 130. In some embodiments, in order to provide additional stability and further safeguard against leakage, a housing cap 310 may be disposed along the exterior of the housing 130. As illustrated, the feedthrough pin 125 extends through an aperture of the housing cap 310, and this aperture may be sized so as to be a tight fit, thereby ensuring a tight seal. The housing cap 310 increases stability by providing another point of attachment for the feedthrough pin 125. The housing cap 310 may be of any shape (e.g., circular, rectangular, triangular, or any other suitable shape). In some embodiments, as illustrated in FIG. 3, the housing cap 310 may be sized so as to be larger than the cross-section of the exterior end of the bore of the housing 130. For example, as illustrated, the cross-section of the exterior end of the bore (e.g., the exterior end of the tapered portion) may be defined by a distance d1 (e.g., a diameter if the bore is circular), and the cross-section of the housing cap 310 may be defined by a distance d2 (e.g., a diameter if the housing cap is circular) that is larger than the distance d1. In this way, the housing cap 310 may be ensured to completely extend over the entirety of the bore, allowing for yet another layer of protection to prevent leakage of liquid via the bore (and also to improve stability). In some embodiments, the housing cap may include a plastic material, a polymer material, an epoxy material, or any other suitable material.

Figure 4:
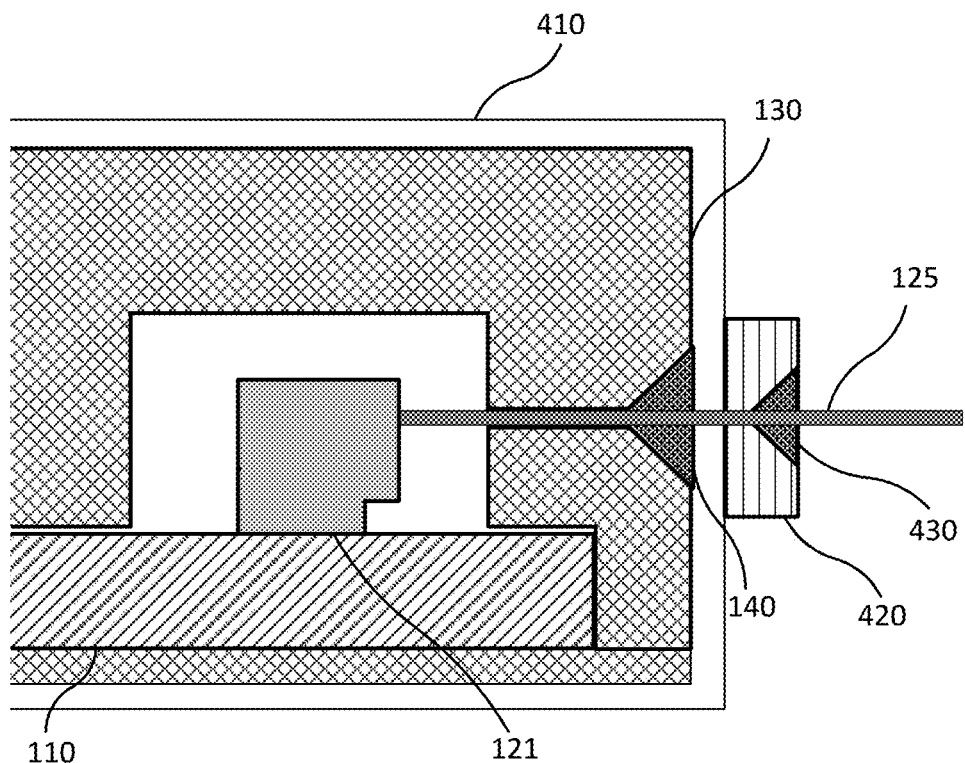
FIG. 4 illustrates a portion of an enclosure with an envelope surrounding the housing 130 and an envelope cap.

FIG. 4 illustrates a portion of an enclosure with an envelope 410 surrounding the housing 130 and an envelope cap 420. In some embodiments, the housing 130 may be made of a material that is not permeable to water. In other embodiments, the housing 130 may be permeable to water under high pressure (e.g., at 10,000 psi; 15,750 psi), and in some cases may be permeable so as to allow water to leak through into the interior of the housing 130. In some embodiments (especially in the embodiments where the housing may be permeable to water), the entire housing 130 of the enclosure may be surrounded by an envelope 410 so as to create a waterproof layer around the housing 130. In these embodiments, the feedthrough pin 125 would need to go through the envelope 410 via an exit aperture of the envelope 410, and this exit aperture may become a source of leakage into the interior of the envelope 410 around the feedthrough pin 125 (and then into the interior of the housing 130). To prevent this leakage, as illustrated in FIG. 4, an envelope cap 420 may be disposed on an exterior of the envelope 410. In some embodiments, similar to the housing cap 310, the envelope cap 420 may be sized so as to be larger than the exit aperture of the envelope 410. In some embodiments, the envelope cap 420 may include a plastic material, a polymer material, an epoxy material, or any other suitable material. In some embodiments, as illustrated in FIG. 4, the envelope cap 420 may include a bore with a tapered portion (e.g., similar to the bore of the housing 130 in the embodiment illustrated in FIG. 4). In some of these embodiments, the tapered bore may be filled with a potting material 430 (e.g., an epoxy material, a polymer material, or any other material suitable for filling in the bore of the envelope cap 420 and creating a seal around the feedthrough pin 125).

In some embodiments, the envelope 410 may be made of a material that is impermeable to liquids (e.g., water) when the enclosure is held at a pressure that the enclosure is expected to be under normal operation (e.g., 10,000 psi; 15,750 psi). For example, the envelope 410 may made of a Mylar-based material, a plastic material, a polymer material, or any other suitable material. In some embodiments, the envelope 410 may be a plastic bag similar to a vacuum bag used to vacuum seal food (e.g., a polyethylene bag, a polyethylene bag with a layer of nylon). In this example, the plastic bag may include one or more plastic (e.g., polyethylene) layers. In some embodiments, the plastic bag may include one or more other layers (e.g., a fabric layer such as a nylon layer, a fabric-containing adhesive such as duct tape) for added strength.

Figure 5:
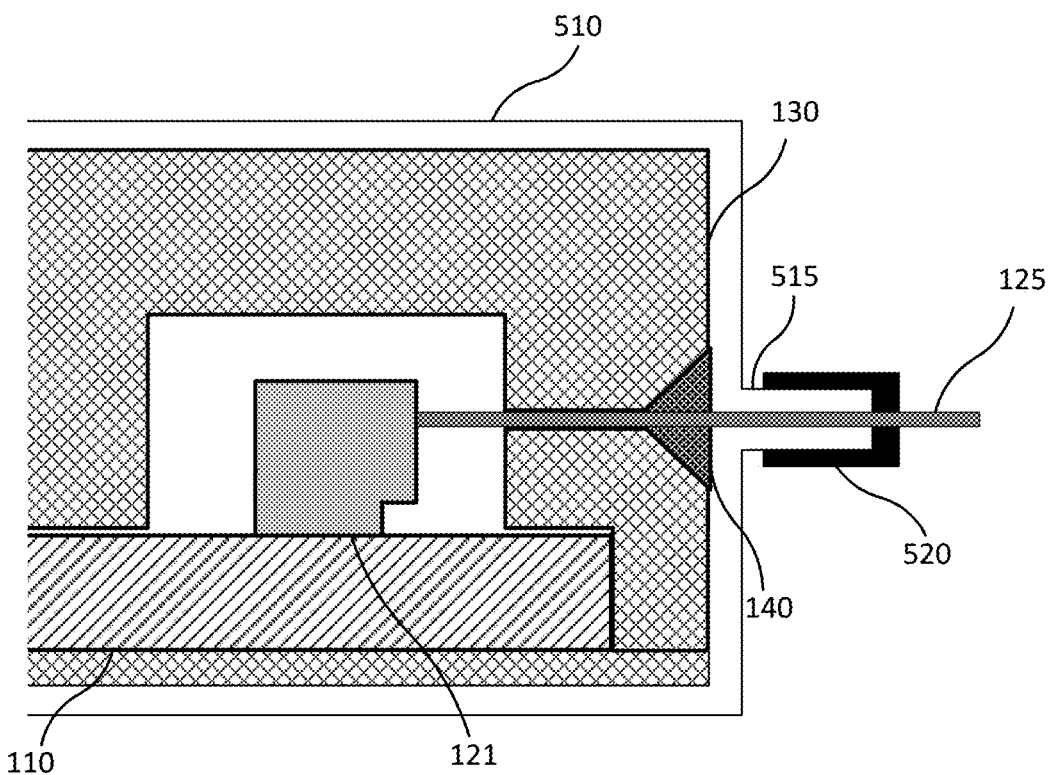
FIG. 5 illustrates a portion of an enclosure with an envelope having an elongated portion through which the feedthrough pin extends.

FIG. 5 illustrates a portion of an enclosure with an envelope 510 having an elongated portion 515 through which the feedthrough pin 125 extends. In some embodiments, the enclosure may include an envelope 510 with an elongated portion that creates a lumen that projects outward. As illustrated in FIG. 5, a feedthrough pin (e.g., the feedthrough pin 125) may be guided through the lumen formed by the elongated portion 515 and ultimately out of an aperture disposed on the elongated portion 515 (e.g., at an end of the elongated portion 515). In some embodiments, a sealing structure 520 may be disposed around at least a part of the elongated portion 515 so as to create a tight seal around the elongated portion 515 that constricts the aperture of the elongated portion 515. For example, the sealing structure 520 may be heat shrink tubing. In this example, the heat shrink tubing may have been slid over the feedthrough pin 125 and the elongated portion 515 and heated such that it constricts around the elongated portion 515 in the feedthrough pin 125 so as to create a tight seal. As another example, the sealing structure 520 may be made of a rubber material, acrylic, or any other material sized and suitable to constrict the elongated portion 515 so as to create a tight seal. As another example, the sealing structure 520 may be a tie (e.g., an elastic tie, a non-elastic tie) or other element that can be wrapped around the elongated portion 515 and constricted.

Figure 6:
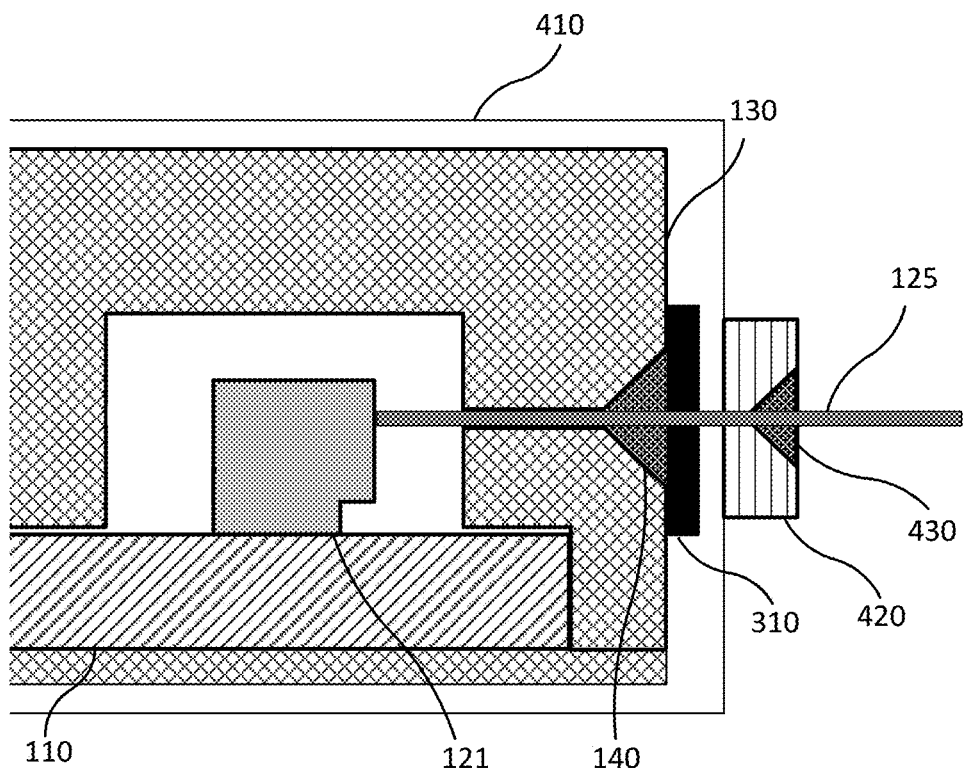
FIG. 6 illustrates a portion of an enclosure with a housing cap, an envelope, and an envelope cap.

FIG. 6 illustrates a portion of an enclosure with a housing cap 310, an envelope 410, and an envelope cap 420. The embodiment illustrated by FIG. 6 is yet another example embodiment. In this embodiment, the housing cap 310 is disposed along the exterior of the housing 130 to cover the potting material 140. The feedthrough pin 125 extends from the interior of the housing 130 through the potting material 140, and then through an aperture of the housing cap 310. As described previously, the housing cap 310 may be sized so as to be larger than the cross-section of the exterior end of the bore of the housing 130 so as to, for example, further prevent leakage and improve stability. An envelope 410 may be disposed around the housing 130 and the housing cap 310. The feedthrough pin 125 may be extended through the envelope 410, and further secured in place by the envelope cap 420. As illustrated in FIG. 6, the envelope cap 420 may include a bore that includes a tapered portion (and may also include a non-tapered portion as illustrated). The feedthrough pin 125 may extend through this bore and may be secured by the potting material 430.

Figure 7:
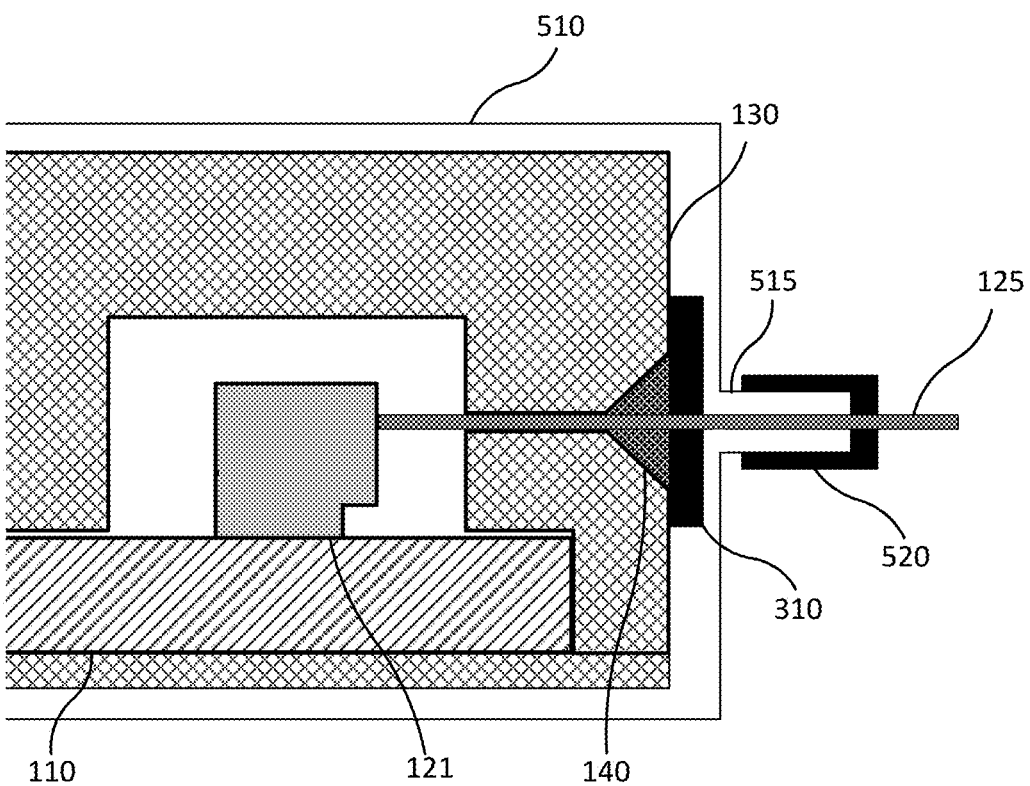
FIG. 7 illustrates a portion of an enclosure with a housing cap, an envelope with an elongated portion, and a sealing structure.

FIG. 7 illustrates a portion of an enclosure with a housing cap 310, an envelope 510 with an elongated portion 515, and a sealing structure 520. FIG. 7 is similar to FIG. 6, except that it includes an envelope 510 having an elongated portion 515 and a sealing structure 520 rather than an envelope cap. The feedthrough pin 125 extends through the lumen created by the elongated portion 515, and out of the envelope 510 via an aperture disposed on the elongated portion (e.g., at an end of the elongated portion 515). As described previously, a sealing structure 520 (e.g., heat shrink tubing, a material sized and suitable to constrict the elongated portion 515, a tie) may be disposed around at least a part of the elongated portion 515 so as to create a seal around the elongated portion 515 that constricts the aperture of the elongated portion 515.

Although the disclosure focuses on embodiments having particular combinations and numbers of elements for stabilizing and sealing the enclosure around one or more feedthrough pins, these are to be considered only as example embodiments. That is, the disclosure contemplates embodiments with any suitable combination or number of the disclosed elements.

FIG. 8 illustrates an example method 800 for manufacturing an enclosure structure with a feedthrough for coupling components housed within the enclosure structure to components external to the enclosure structure. The method may include, forming a housing comprising one or more cavities for receiving one or more electronic components within an interior of the housing, wherein the one or more electronic components comprises a connector element (810). The method may include forming a bore through the housing, wherein the bore comprises a non-tapered portion and a tapered portion, the non-tapered portion being proximate to the interior of the housing and the tapered portion being proximate to the exterior of the housing (820). The method may include inserting a feedthrough pin through the bore for coupling the connector element to an external component external to the enclosure structure, wherein a first end of the connector element is configured to be coupled to the connector element and a second end of the connector element is configured to be coupled to the external component (830). The method may include disposing a potting material within the tapered portion surrounding the feedthrough pin (840).

In some embodiments, the method may include placing the housing within an envelope (e.g., the envelope 410 in FIG. 4, the envelope 510 in FIG. 5). The envelope may be impermeable to water when the enclosure structure is held at 15,750 pounds per square inch. A feedthrough pin may then be caused to extend to an exterior of the envelope by any suitable means. For example, referencing FIG. 4, the feedthrough pin 125 may be extended to the exterior of the envelope 410 year via an aperture in the envelope 410. As another example, referencing FIG. 5, the feedthrough pin 125 may be extended through an aperture of the elongated portion 515 of the envelope 510. In some embodiments, feedthrough pin 125 may be caused to extend through an aperture of a housing cap 310 (e.g., as illustrated in FIGS. 3, 6, and 7), an aperture of an envelope cap 420 (e.g., as illustrated in FIGS. 4 and 6). In some embodiments, a sealing structure 520 may be used as described and illustrated with respect to FIGS. 5 and 7. For example, referencing FIG. 5, the feedthrough pin 125 may be extended through an aperture of the elongated portion 515, a sealing structure 520 (e.g., a heat shrink tubing or any other suitable element) may be disposed over the feedthrough pin 125 and the elongated portion 515, and the sealing structure 520 may then be shrunk (e.g., by applying energy such as heat) so as to create a seal between the elongated portion 515 and the feedthrough pin 125.

Particular embodiments may repeat one or more steps of the method of FIG. 8, where appropriate. Although this disclosure describes and illustrates particular steps of the method of FIG. 8 as occurring in a particular order, this disclosure contemplates any suitable steps of the method of FIG. 8 occurring in any suitable order. Moreover, although this disclosure describes and illustrates an example method for manufacturing an enclosure structure with a feedthrough for coupling components housed within the enclosure structure to components external to the enclosure structure, including the particular steps of the method of FIG. 8, this disclosure contemplates any suitable method for manufacturing an enclosure structure with a feedthrough for coupling components housed within the enclosure structure to components external to the enclosure structure, including any suitable steps, which may include all, some, or none of the steps of the method of FIG. 8, where appropriate. Furthermore, although this disclosure describes and illustrates particular components, devices, or systems carrying out particular steps of the method of FIG. 8, this disclosure contemplates any suitable combination of any suitable components, devices, or systems carrying out any suitable steps of the method of FIG. 8. Finally, although the steps of the method of FIG. 8 are listed as distinct steps, the disclosure contemplates that any of the steps may be performed in combination (e.g., simultaneously and concurrently).

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An enclosure structure suitable for high-pressure environments, the enclosure structure having a feedthrough for coupling components housed within the enclosure structure to components external to the enclosure structure, the enclosure structure comprising:
  a housing comprising one or more cavities for receiving one or more electronic components within an interior of the housing, wherein the one or more electronic components comprises a connector element;
  a bore through the housing, wherein the bore comprises a non-tapered portion and a tapered portion, the non-tapered portion being proximate to the interior of the housing and the tapered portion being proximate to an exterior of the housing, and wherein the bore is configured to receive a feedthrough pin for coupling the connector element to an external component external to the enclosure structure;
  a feedthrough pin extending through the bore, the feedthrough pin having a first end and a second end, wherein the first end is configured to be coupled to the connector element and the second end is configured to be coupled to the external component; and
  a potting material disposed within the tapered portion surrounding the feedthrough pin.

2. The enclosure structure of claim 1 further comprising an envelope surrounding the housing, wherein the envelope is impermeable to water when the enclosure structure is held at 15,750 pounds per square inch, and wherein the feedthrough pin extends to an exterior of the envelope.

3. The enclosure structure of claim 2 further comprising an envelope cap disposed on the exterior of the envelope, wherein the feedthrough pin extends to the exterior of the envelope via the envelope cap.

4. The enclosure structure of claim 3 wherein the envelope cap comprises:
  an envelope-cap bore through which the feedthrough pin extends, the envelope-cap bore comprising a tapered portion; and
  a potting material disposed within the envelope-cap bore surrounding the feedthrough pin.

5. The enclosure structure of claim 2 wherein the envelope comprises an elongated portion, wherein the feedthrough pin extends to the exterior of the envelope via the elongated portion, and wherein the enclosure structure further comprises a sealing structure disposed around at least part of the elongated portion.

6. The enclosure structure of claim 5 wherein the sealing structure comprises a heat shrink tubing.

7. The enclosure structure of claim 2 wherein the envelope comprises a mylar-based material or a plastic material.

8. The enclosure structure of claim 1 wherein the housing comprises a fiberglass composite material.

9. The enclosure structure of claim 1 further comprising a housing cap disposed along the exterior of the housing over the potting material.

10. The enclosure structure of claim 1 wherein the potting material is an epoxy.

11. The enclosure structure of claim 1 wherein the one or more electronic components comprises a battery or one or more circuit components on a circuit board assembly.

12. The enclosure structure of claim 1 wherein the tapered portion comprises an interior end facing the interior of the housing and an exterior end facing an exterior of the housing, wherein a cross-section of the interior end is less than a cross-section of the exterior end.

13. The enclosure structure of claim 12 wherein the non-tapered portion comprises a cylindrical portion, and wherein the tapered portion comprises a conical portion.

14. A method of manufacturing an enclosure structure with a feedthrough for coupling components housed within the enclosure structure to components external to the enclosure structure, the method comprising:
- forming a housing comprising one or more cavities for receiving one or more electronic components within an interior of the housing, wherein the one or more electronic components comprises a connector element;
- forming a bore through the housing, wherein the bore comprises a non-tapered portion and a tapered portion, the non-tapered portion being proximate to the interior of the housing and the tapered portion being proximate to an exterior of the housing;
- inserting a feedthrough pin through the bore for coupling the connector element to an external component external to the enclosure structure, wherein a first end of the connector element is configured to be coupled to the connector element and a second end of the connector element is configured to be coupled to the external component; and
- disposing a potting material within the tapered portion surrounding the feedthrough pin.

15. The method of claim 14 further comprising:
- placing the housing within an envelope, wherein the envelope is impermeable to water when the enclosure structure is held at 15,750 pounds per square inch; and
- causing the feedthrough pin to extend to an exterior of the envelope.

16. The method of claim 15 further comprising causing the feedthrough pin to extend through an envelope cap disposed on the exterior of the envelope.

17. The method of claim 16 wherein the envelope cap comprises:
- an envelope-cap bore through which the feedthrough pin extends, the envelope-cap bore comprising a tapered portion; and
- a potting material disposed within the envelope-cap bore to surround the feedthrough pin so as to create a seal around the feedthrough pin.

18. The method of claim 15 further comprising disposing an envelope cap on the exterior of the envelope around the feedthrough pin so as to create a seal around the feedthrough pin.

19. The method of claim 15 further comprising:
- extending the feedthrough pin through an elongated portion of the envelope to the exterior of the envelope; and
- disposing a sealing structure around at least part of the elongated portion so as to create a seal between the elongated portion and the feedthrough pin.

20. The method of claim 19 wherein the sealing structure comprises a heat shrink tubing, wherein disposing the sealing structure comprises:
- placing the heat shrink tubing around the elongated portion; and
- applying heat to the heat shrink tubing to cause the heat shrink tubing to shrink and wrap around the elongated portion and the feedthrough pin.

* * * * *